United States Patent [19]

Knoll et al.

[11] Patent Number: 5,115,160
[45] Date of Patent: May 19, 1992

[54] EASILY ENCODABLE SURFACE ACOUSTIC WAVE (SAW) SECURITY DEVICES

[75] Inventors: William C. Knoll, Turbotville, Pa.; James R. McColl, Concord, Mass.; James O. Lawson, Williamsport, Pa.

[73] Assignee: GTE Products, Danvers, Mass.

[21] Appl. No.: 399,126

[22] Filed: Aug. 28, 1989

[51] Int. Cl.⁵ .......................................... H01L 41/08
[52] U.S. Cl. ........................ 310/313 B; 310/313 R; 333/154; 340/825.31
[58] Field of Search ........... 310/313 R, 313 B, 313 C, 310/312; 333/150, 154, 193, 195, 196, 152; 342/44, 51; 340/825.3, 825.31

[56] References Cited

U.S. PATENT DOCUMENTS

| | | | |
|---|---|---|---|
| 3,706,094 | 12/1972 | Cole et al. | 342/51 |
| 3,707,711 | 12/1972 | Cole et al. | 343/700 MS |
| 3,942,135 | 3/1976 | Moor et al. | 333/150 X |
| 3,952,269 | 4/1976 | Bristol | 310/313 R |
| 4,059,831 | 11/1977 | Epstein | 333/152 X |
| 4,096,477 | 6/1978 | Epstein | 310/313 R X |
| 4,663,664 | 5/1987 | Ragan et al. | 333/154 X |
| 4,682,223 | 7/1987 | Ragan et al. | 235/487 X |
| 4,682,224 | 7/1987 | Ragan et al. | 235/487 X |
| 4,931,664 | 6/1990 | Kroll | 310/313 R X |
| 4,945,354 | 7/1990 | McColl | 310/313 R X |

FOREIGN PATENT DOCUMENTS 2044570 10/1980 United Kingdom .............. 333/152

*Primary Examiner*—Mark O. Budd
*Attorney, Agent, or Firm*—Salzman & Levy

[57] ABSTRACT

This invention features a method for encoding surface acousting wave (SAW) delay lines. The method uses a split-electrode transducer as a programmable reflector. When shorted out, it does not reflect surface waves. When open-circuited, it partially reflects incident surface waves. As manufactured by conventional photolithographic methods, each of several such transducers is shorted out by a fusible link. In the as-manufactured state, the array of shorted transducers produces no reflection of surface waves. If a fusible link is destroyed by passage of electric current or other means, the corresponding transducer becomes a partial reflector. The status of these switchable reflectors may be read by exciting a separate launch transducer with a burst of electromagnetic energy containing substantial energy at the basis operating frequency of the SAW transducers or at suitable harmonics. SAW energy reflected by the switchable reflectors appears at the same transducer at delay times determined by the spacing of the elements. The presence of a pulse at a given delay time indicates that the corresponding fusible link has been destroyed; conversely, absence of the pulse indicates that the fusible link is intact. Thus, destruction of fusible links provides a method for encoding SAW devices for security and other applications, in situ.

32 Claims, 4 Drawing Sheets

EASILY ENCODABLE SURFACE ACOUSTIC WAVE (SAW) SECURITY DEVICES

RELATED APPLICATIONS

This application is related to co-pending patent applications, as follows: Ser. No. 227,282, filed Aug. 2, 1988, titled CODED SURFACE ACOUSTICAL WAVE (SAW) MOTOR VEHICLE SECURITY DEVICE; Ser. No. 276,072, filed Nov. 25, 1988, titled SPURIOUS SIGNAL CORRECTION FOR SURFACE ACOUSTIC WAVE (SAW) SECURITY DEVICES; and Ser. No. 07/399,133 filed 8/28/89, titled A MULTIPLEXED SURFACE ACOUSTICAL WAVE APPARATUS; and hereby incorporates by way of reference all of the teachings and description therein.

BACKGROUND OF THE INVENTION

I. Field of the Invention The invention relates to automotive antitheft devices utilizing surface acoustic wave (SAW) devices, and more particularly to automotive antitheft SAW devices that can be easily encoded in situ at an automobile dealer's garage.

Motor vehicles are susceptible to theft due to their relative high value and inherent transportability. Automobiles and trucks are especially attractive as objects of theft, as evidenced by an alarmingly high theft rate in many civilized countries.

Recently, it has been proposed to employ surface acoustic or acoustical wave devices as security devices for automotive vehicles. See, for example, the above-cited related applications.

A SAW system generally includes an interrogator for transmitting a first radio frequency (RF) signal and a SAW transponder which receives the signal, processes it and sends back a second RF signal containing encoded information. Transducers arranged at prescribed spaced intervals along the acoustic path of the transponder convert the acoustic wave back into electrical energy. The presence or absence of transducers at prescribed locations along the acoustic wave path determines whether a reply pulse will be transmitted with a particular time delay in response to an interrogation pulse. This determines the informational code contained in the transponder reply.

A significant difficulty is presented by the logistical problems of manufacturing and distributing SAW devices when a great number of codes is possible. As one example, consider the difficulty of replacing a lost key needed for motor vehicle ignition or security system activation if the key contains a SAW transponder that must be programmed in the factory. If the possible number of embedded codes is great, then either a local distributor must stock a large number of replacement key blanks, or the user must wait a considerable time for a replacement to be shipped. Both solutions are commercially unacceptable. Many other situations involving a need to program SAW transponders locally can also be imagined.

It would be highly desirable to provide a means for encoding SAW transponders in situ, such as in the automobile dealer's garage.

It is, therefore, an object of the present invention to obviate the disadvantages of the prior art.

It is another object of the invention to enhance the programmability of SAW devices.

These objects are accomplished, in one aspect of the invention, by the provision of programmable or switchable reflective transponders, together with a method of making same. The basic programmable reflector consists of a split-electrode transducer which when electrically short-circuited does not reflect surface waves, but which when open-circuited partially reflects incident surface waves. Each programmable reflector in the as-manufactured state is short circuited by a fusible link. Programming is accomplished in situ by destroying the fusible link, thereby causing the programmable reflector to be open-circuited.

BRIEF DESCRIPTION OF THE DRAWINGS

A complete understanding of the present invention may be obtained by reference to the accompanying drawings, when taken in conjunction with the detailed description thereof and in which.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
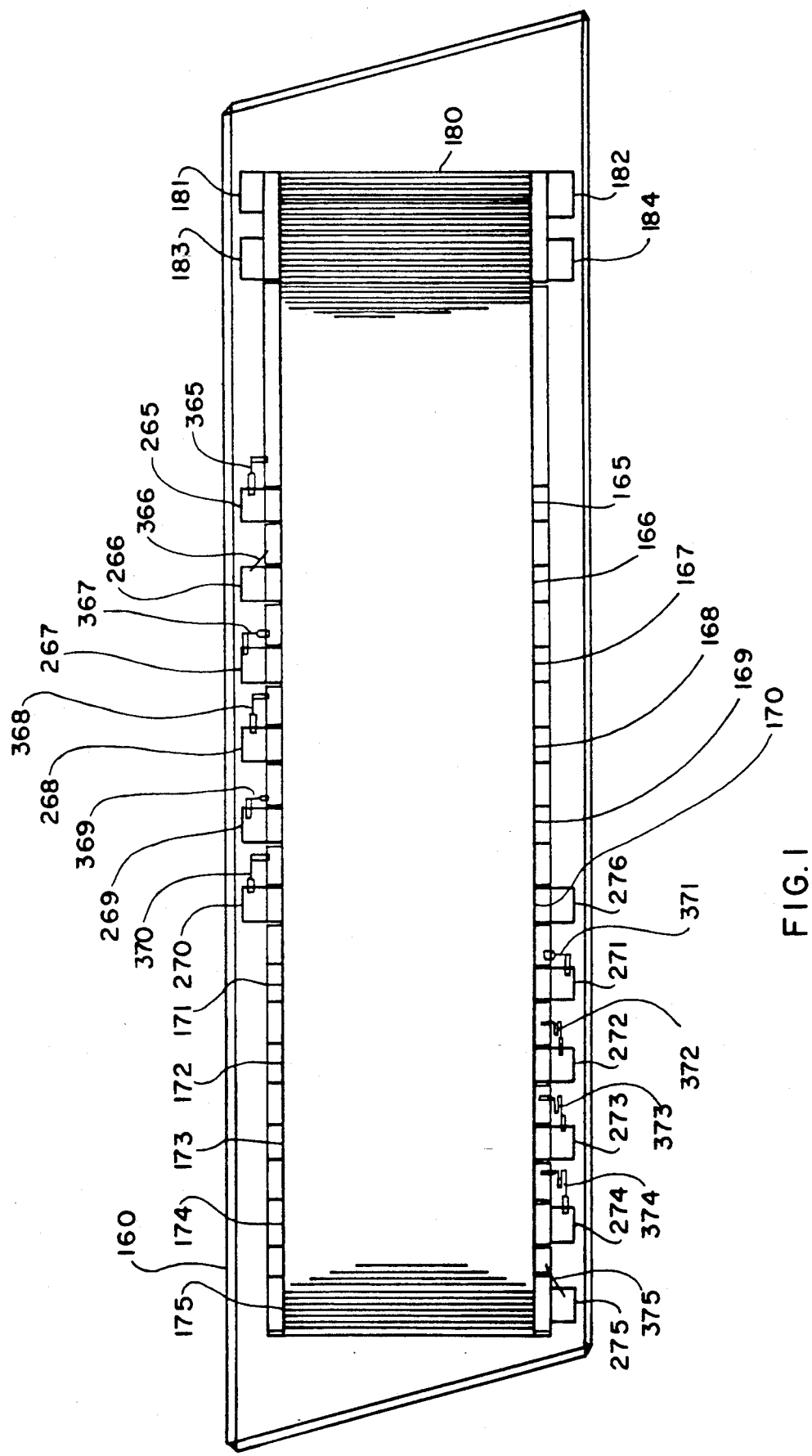
FIG. 1 is an exploded plan view of the encodable SAW device of this.

Referring now to FIG. 1, there is shown an example of the layout of a main or launch transducer, programmable reflectors, fusible links, and other elements of this invention. The whole structure is produced by conventional photolithography on piezoelectric substrate 160 and is embedded in a mettallic TO-8 package, not shown. The main transducer 180 may be either the single or double electrode type, and it may be either uniform or apodized.

Figure 2:
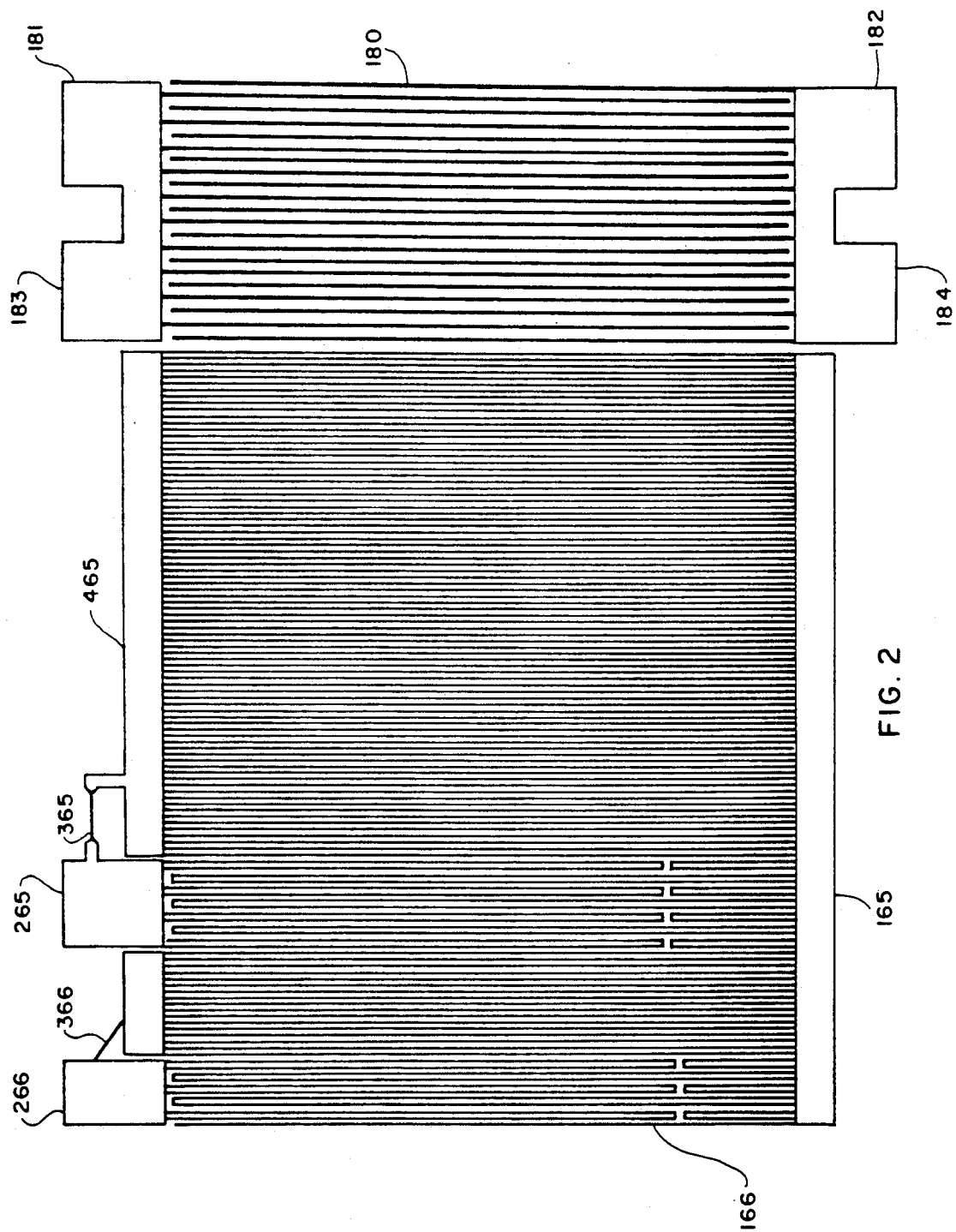
FIGS. 2-4 are further exploded partial views of the SAW device of FIG. 1.
Figure 3:
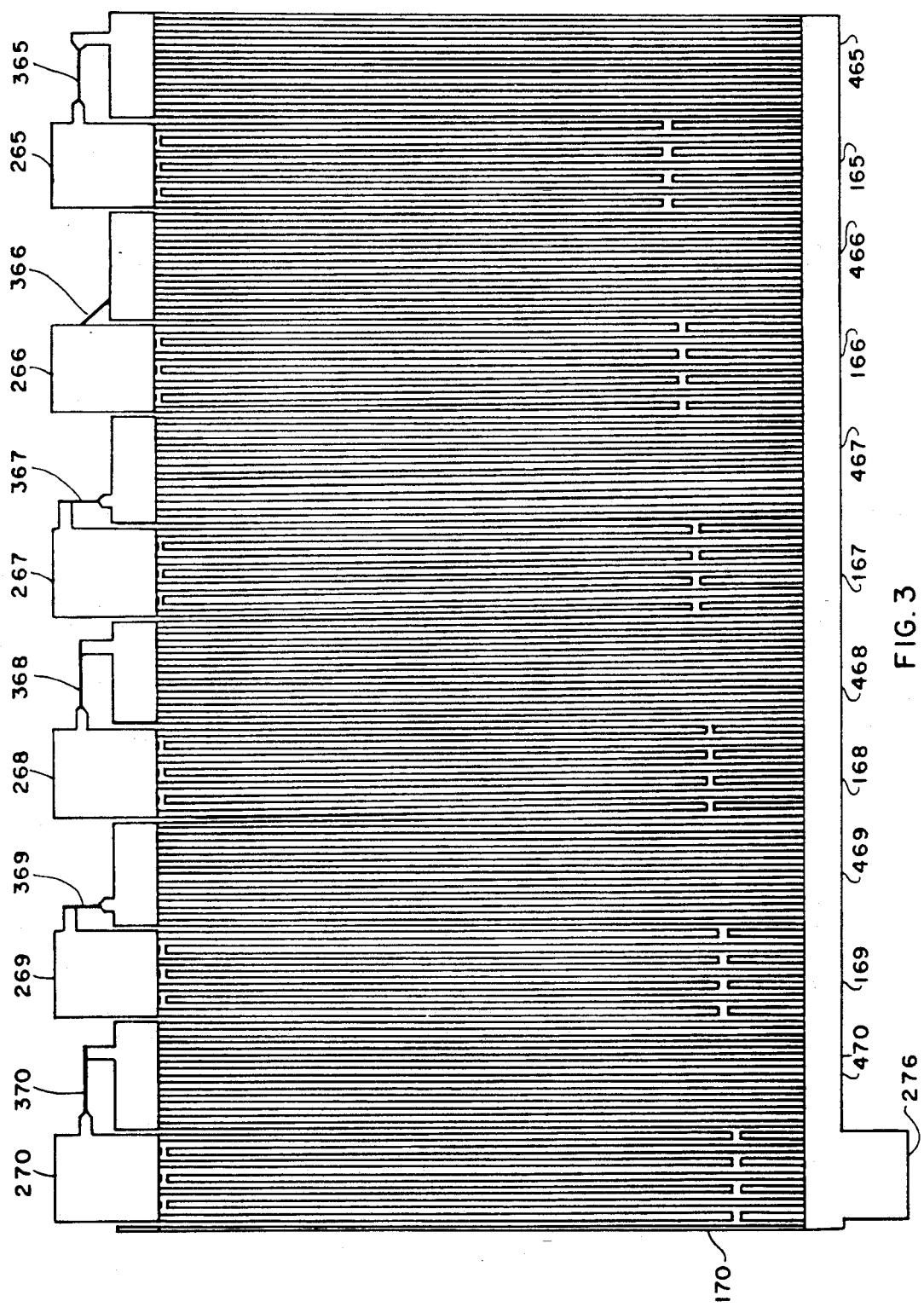
Figure 4:
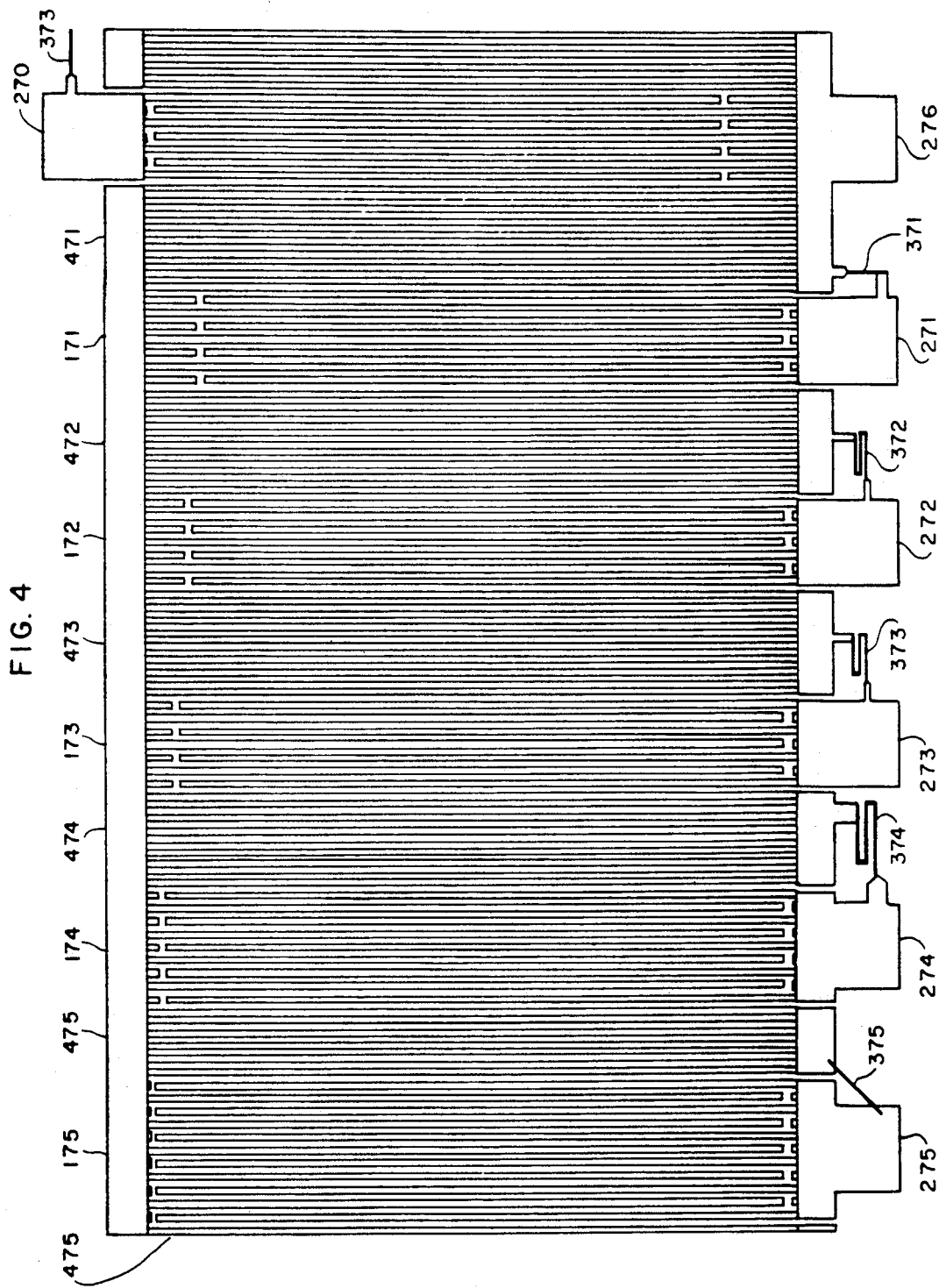

Expanded views of FIG. 1 are shown in FIGS. 2-4. In this example, main transducer 180 is a single-electrode uniform transducer; that is, the electrode spacing is one-half of the SAW wavelength corresponding to the basic operating frequency. Bonding pads 181, 182, 183 and 184 are provided so that bonding wires may be connected to package pins or interconnects. At least two bonding pads are required for the main or launch transducer; in this example, four bonding pads are provided for additional reliability.

In the example of FIG. 1, eleven programmable reflectors 165-175 are shown. Each programmable reflector 165-175 has one bonding pad 265-275 and a fusible link 365-375 connected to it. The regions between the main transducer and programmable reflectors is filled with spacers 464-476. The programmable reflectors 165-175 and spacers 464-476 both contain electrodes whose spacing is one-quarter of the SAW wavelength. The function of the spacers 464-476 is to provide a continuous medium for surface acoustic wave propagation and to provide a current return path for opening fusible links 365-375.

Inspection of FIGS. 1-4 will reveal that one busbar of the spacers and programmable reflectors not connected to bonding pads 265-275 is continuous. Thus each of the fusible links 365-375 causes one programmable reflector to be short-circuited. In addition, each spacer is electrically connected to return current bonding pad 276. When voltage is applied between one of the bonding pads 265-275 and bonding pad 276, current flows through the corresponding fusible link 365-375. The fusible links are designed so that the electrical current density is much higher in the link than anywhere else along the current path. For this reason, the fusible links reach their melting point before the spacers, electrodes, busbars, bonding pads or bonding wires do, and are destroyed by melting. Applying a voltage in this manner encodes the programmable reflector.

There is an optimum range of electric current for destroying the fusible links. If the current is too low, the links will not melt. If it is too high, the links will melt so rapidly that a gap will begin to form in the link while the underlying substrate has not yet begun to heat; this causes the metal to freeze instantly, leaving a frozen-in small gap that could cause reliability problems due to electromigration. An intermediate current, however, allows the substrate under the melted link to heat sufficiently so that an initial gap in the link is permitted to grow substantially before the metal freezes. Experimentation with aluminum films of 400 nm thickness has shown that 150 milliamperes is sufficient to ensure conclusive destruction of serpentine links 372-374, while 200 milliamperes is sufficient to destroy all links 365-375.

For ease of manufacture, it is desirable that all structures be made of the same metal. Aluminum is the preferred metal because its low density yields minimal mass loading effects, and its low melting point (660° C.) prevents damage to the transponder when fusible links are melted.

FIGS. 1-4 illustrate a variety of possible configurations for the fusible links. The basic requirement is that upon passage of electric current, the link should reach its melting point before any other part of the structure. Fusible links 372-374 are serpentine to concentrate the heat developed by the electrical current, and have been found to provide a more efficient result.

In the example shown in FIGS. 1-4, the active overlap regions of the various programmable reflectors are unequal; the reflectors nearest the main or launch transducer have shorter overlaps than do the further reflectors. This is to compensate for acoustic wave losses. This compensation tends to make the reflected surface wave energy from each reflector more nearly equal than would be the case if every reflector had equal overlaps. Other means to accomplish this may be employed, such as the separate acoustic track method disclosed in United States Pat. No. 4,625,208.

One form of spurious signal that can interfere with proper interpretation of the signal received by the main transducer is a quadruple transit signal. The desired response is due to a double transit. That is, a SAW wave is emitted by the main transducer 180, is reflected by a programmable reflector and is received by the main transducer; a SAW wave emanates from the main transducer, is reflected by a programmable reflector, is reflected again by the main transducer, is reflected by yet another programmable reflector, and is finally received by the main transducer.

To minimize the impact of quadruple transit interference, the principle of time shifting can be employed. In accordance with this principle, the positions of the programmable reflectors are chosen so that the reflected pulses arrive at the main transducer in half-integer multiples of a basic bit-timing period. Then quadruple transit spurious signals arrive at integer multiples of the bit-timing period. If this is done, the spurious signals and desired code signals arrive at different times and therefore do not interfere.

The fusible links are easily melted in situ (e.g., in the garage of an automobile dealer or mechanic). Therefore, the keys of the automobile can be easily fabricated in situ, thus providing a cost-effective means of practicing the SAW wave security method.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the present invention, what is desired to be protected by Letters Patent is presented by the following appended claims.

What is claimed is:

1. A device that provides a code of surface acoustic waves, whose code is settable in an in situ environment comprising:

means defining a number of surface acoustic wave units arranged to provide a coded sequence, each of said number of surface acoustic wave units being operative in one of two conditions, a first condition wherein a surface acoustic wave unit is substantially wave reflective, and a second condition wherein a surface acoustic wave unit is substantially wave non-reflective, each of said number of surface acoustic wave units including a fusible link that is fusible in an in situ environment, and when openly fused changes said surface acoustic wave unit from said second condition to said first condition, thus defining a sequential code, means defining a pulse emitting main surface acoustic wave unit disposed upstream of said number of surface acoustic wave units, and means defining chosen positions for said surface acoustic wave units such that reflected waves therefrom will arrive at said pulse emitting main surface acoustic wave unit in a half-integer of a pulse emitted from said pulse emitting main surface acoustic wave unit, whereby quadruple transit spurious signals that arrive at integer multiples of a pulse emitted from said pulse emitting main surface acoustic wave unit will be distinguishable from said coded, reflective sequence of said surface acoustic wave units.

2. The device of claim 1, wherein each fusible link is openly fused by individualized application of an electrical current thereto.

3. The device of claim 1, wherein each fusible link is openly fused by individualized application of energy to heat and melt said fusible link.

4. The device of claim 1, further comprising a substrate defining an acoustic wave path, and wherein said surface acoustic wave units include a serial arrangement of transducers disposed upon said substrate along said acoustic path.

5. The device of claim 4, wherein said transducers have split-electrodes.

6. The device of claim 4, wherein said main surface acoustic wave unit further comprises a launch transducer disposed upon said substrate for propagating an acoustic wave along said path.

7. The device of claim 4, wherein each transducer is spaced a predetermined distance along said acoustic wave path.

8. The device of claim 4, wherein each fusible link is operatively connected to a respective transducer and is openly fusible to provide an open circuit in said transducer.

9. The device of claim 8, wherein each fusible link comprises an electrically conductive ribbon.

10. The device of claim 9, wherein said ribbon has a serpentine shape to facilitate heat build-up during fusing thereof.

11. The device of claim 4, wherein said substrate comprises piezoelectric material.

12. The device of claim 4, wherein said transducers are photolithographed on said substrate.

13. The device of claim 6, wherein said launch transducer has a single electrode.

14. The device of claim 6, wherein said launch transducer has a double electrode.

15. The device of claim 6, wherein said launch transducer is uniform.

16. The device of claim 6, wherein said launch transducer is apodized.

17. The device of claim 1, for use in an automotive vehicle.

18. A device having a code derived from an arrangement of reflective and non-reflective surface acoustic wave units that are respectively programmable in situ, comprising:
   a substrate defining an acoustic wave propagating path;
   a launch transducer disposed upon said substrate for providing a surface acoustic wave for propagation along said path;
   a number of programmable transducers disposed along said wave propagating path of said substrate, each being operative in one of two conditions, a first condition wherein said programmable transducer is substantially non-reflective, and a second condition wherein said programmable transducer is substantially reflective;
   a fusible link associated with each programmable transducer that is openly fusible in situ, so that each of said respective programmable transducers can become substantially reflective when said fusible link associated therewith is opened, whereby certain ones of said programmable transducers are reflective while certain others of said programmable transducers remain non-reflective, thereby forming a code; and
   means defining chosen positions for said programmable transducers along said wave propagating path, such that reflected waves therefrom will arrive at said launch transducer in a half-integer of a pulse emitted from said launch transducer, whereby quadruple transit spurious signals that arrive at integer multiples of a pulse launched from said launch transducer will be distinguishable from said coded, reflective sequence of said programmable transducers.

19. The device of claim 18, wherein each fusible link is openly fused by individualized application of an electrical current thereto.

20. The device of claim 18, wherein each fusible link is openly fused by individualized application of energy to heat and melt said fusible link.

21. The device of claim 18, wherein said programmable transducers have split-electrodes.

22. The device of claim 18, wherein each programmable transducer is spaced a predetermined distance along said acoustic wave propagating path.

23. The device of claim 18, wherein each fusible link is operatively connected to a respective transducer and is openly fusible to provide an open circuit in said transducer.

24. The device of claim 18, wherein each fusible link comprises an electrically conductive ribbon.

25. The device of claim 24, wherein said ribbon has a serpentine shape to facilitate heat build-up during fusing thereof.

26. The device of claim 18, wherein said substrate comprises piezoelectric material.

27. The device of claim 18, wherein said transducers are photolithographed on said substrate.

28. The device of claim 18, wherein said launch transducer has a single electrode.

29. The device of claim 18, wherein said launch transducer has a double electrode.

30. The device of claim 18, wherein said launch transducer is uniform.

31. The device of claim 18, wherein said launch transducer is apodized.

32. The device of claim 18, for use in an automotive vehicle.

* * * * *